United States Patent [19]
Atwater et al.

[11] Patent Number: 5,851,319
[45] Date of Patent: *Dec. 22, 1998

[54] METHOD AND APPARATUS FOR SELECTIVELY ANNEALING HETEROSTRUCTURES USING MICROWAVES

[75] Inventors: Harry A. Atwater, Pasadena, Calif.; Ruth A. Brain, Portland, Oreg.; Martin B. Barmatz, La Crescenta, Calif.

[73] Assignee: California Institute of Technology, Pasadena, Calif.

[ * ] Notice: The term of this patent shall not extend beyond the expiration date of Pat. No. 5,707,466.

[21] Appl. No.: 911,304

[22] Filed: Aug. 14, 1997

Related U.S. Application Data

[62] Division of Ser. No. 415,073, Mar. 31, 1995, Pat. No. 5,707,466.

[51] Int. Cl.$^6$ .................................................. H01L 21/324
[52] U.S. Cl. ........................ 148/525; 219/709; 438/660; 438/663
[58] Field of Search ............................. 148/525; 219/709; 438/660, 663

[56] References Cited

U.S. PATENT DOCUMENTS

| | | | |
|---|---|---|---|
| 4,273,950 | 6/1981 | Chitre | 136/255 |
| 4,474,625 | 10/1984 | Cohen et al. | 438/799 |
| 5,521,360 | 5/1996 | Johnson et al. | 219/709 |
| 5,707,466 | 1/1998 | Atwater et al. | 148/525 |

*Primary Examiner*—George Wyszomierski
*Attorney, Agent, or Firm*—Michaelson & Wallace

[57] ABSTRACT

The present invention discloses a process for selectively annealing heterostructures using microwaves. A heterostructure, comprised of a material having higher microwave absorption and a material having lower microwave absorption, is exposed to microwaves in the cavity. The higher microwave absorbing material absorbs the microwaves and selectively heats while the lower microwave absorbing material absorbs small amounts of microwaves and minimally heats. The higher microwave absorbing material is thereby annealed onto the less absorbing material which is thermally isolated.

4 Claims, 3 Drawing Sheets

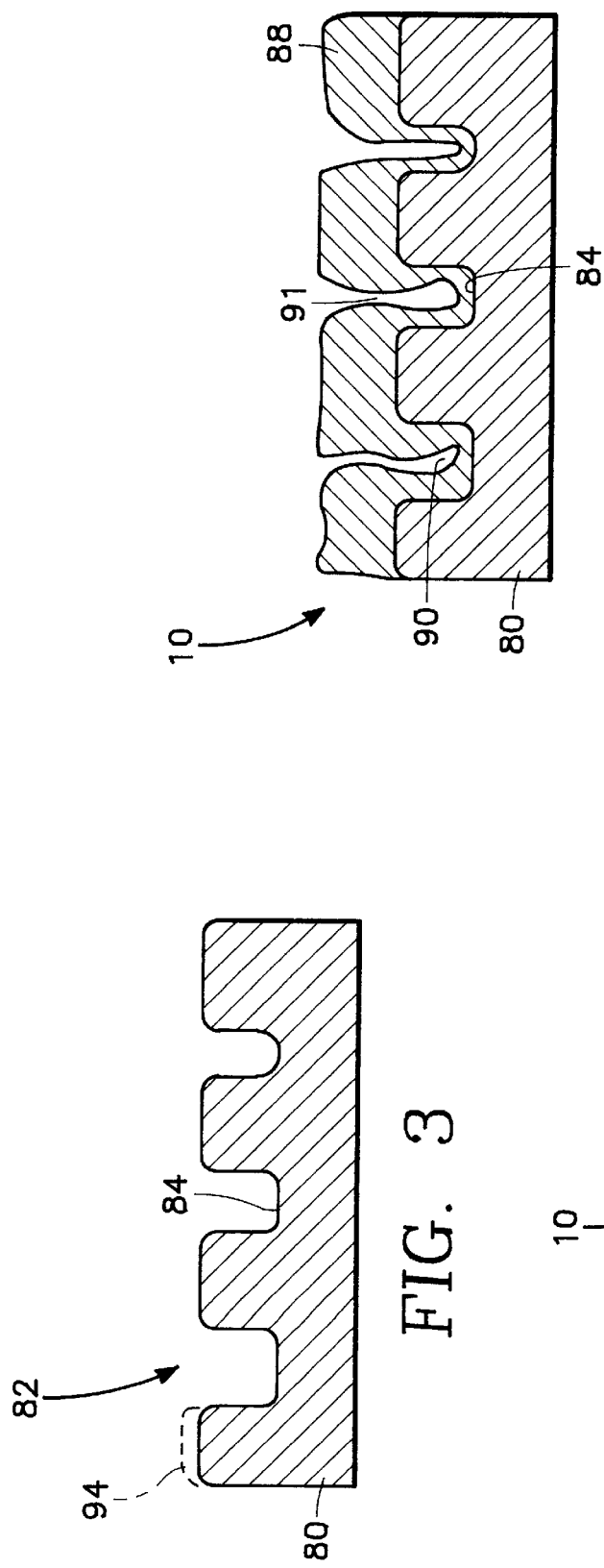

METHOD AND APPARATUS FOR SELECTIVELY ANNEALING HETEROSTRUCTURES USING MICROWAVES

This is a division of application Ser. No. 08/415,073, filed Mar. 31, 1995, now U.S. Pat. No. 5,707,466.

ORIGIN OF THE ONVENTION

The invention described herein was made in the performance of work under a NASA contract and National Science Foundation Grant No. DMR 895 8070, and is subject to the provisions of Public Law 96-517 (35 USC 202) in which the contractor has elected to retain title.

BACKGROUND OF THE INVENTION

1. Field of the Invention

The present invention relates, in general, to annealing materials using microwaves, and in particular, to selectively annealing portions of heterostructures having relatively higher microwave absorption than other portions with lower microwave absorption.

2. Related Art

An integrated circuit is an organized assembly of interconnected electrode components contained within an upper layer of a small, flat semiconductor chip, which can be made of silicon. The fabrication of the integrated circuit is a precise and complicated process. A series of production steps, such as lithography, etching, and annealing to cause diffusion of dopant impurities into the silicon, is carried out on the unprotected silicon surface to produce various regions of individual transistors, diodes, and resistors, ie. the device layer. Then these devices are isolated by a dielectric cap, which can be silicon dioxide ($SiO_2$). The dielectric is patterned and etched to define geometric features, typically, vias and grooves.

Finally, a network of conductive interconnections is applied to the surface of the semiconductor to interconnect the various components. Thin films of conducting material, such as copper (Cu) or aluminum (Al), are deposited into the grooves of the substrate. This conducting film is then polished back, by methods such as Chemical-Mechanical Polishing (CMP), to produce the "wires" that connect the various devices. There are typically several such metal layers.

However, some of the above mentioned steps are no longer sufficient for more advanced integrated circuit technology. For interconnect fabrication, advances in integrated circuit technology have driven a reduction in the minimum feature size of the interconnects. Because the individual components of an integrated circuit (IC) can be formed within the same semiconductor matrix, components can be packed close together to densities over several hundred thousand per semiconductor chip. This reduction enables increases in the device speed and density. This trend has placed severe constraints on interconnect fabrication technology because the cross sectional area of the interconnect decreases as the device dimension is scaled down. In order to minimize interconnect capacities, interconnection levels are separated by dielectric layers of increasing thickness. Hence, advanced interconnect schemes require the formation of continuous metal lines in very high aspect ratio microstructures.

Physical vapor deposition is an interconnect fabrication technique for depositing the very thin layer of material, about a few microns in thickness, upon the substrate. The conventional physical vapor deposition (PVD) technique used for IC fabrication is sputtering. In the sputtering method, materials are bombarded with an ionized inert gas, such as argon, and are deposited onto the substrate. Thus, a metal, such as copper, is deposited onto the substrate and, ideally, into the patterned grooves of the substrate by PVD alone. However, these techniques do not provide a filled via or groove, which is essential for multilevel metallization in high density integrated circuits, as typical sizes enter the sub-micron region and aspect ratios become greater than 1 (aspect ratio=height/width). The grooves are not fully filled, thus creating voids within the vias and trenches that connect the devices. Thus, IC fabrication becomes nearly impossible since these defects produce unreliable interconnections and will result in failure of the integrated circuit.

A possible solution to these voids is to heat the metal to cause it to diffuse and planarize, thereby filling the voids. Heating the metal layer to remove voids is done with infrared heating. Device defects can be caused by the interdiffusion of interconnect metals into the surrounding dielectric material and into the device layer. Since infrared heating exposes the entire wafer to intense heat, the multiple heat treatments required can cause the metal used for interconnects to diffuse into the device regions and cause device failure. Also, since the entire wafer is being heated, the dopants in the device layer will diffuse and thereby degrade or ruin device performance.

Thus, a major concern in the semiconductor industry is to increase the density of devices on the IC and the overall IC speed. This requires processes that use small portions of the total thermal budget and, in particular, requires processes to fill high aspect-ratio trenches at lower temperatures. Lower processing temperatures increase the device reliability and lifetime.

Therefore, what is needed is a technique to process integrated circuits with lower processing temperatures. What is also needed is a technique for enhancing interconnect fabrication of integrated circuits resulting in improved interconnections. What is also needed is the ability to selectively heat and anneal a portion of the heterostructure while refraining from heating other portions. What is further needed is a technique to minimize the diffusion of a first portion of a heterostructure into a second portion, while the first portion in close proximity, is heated.

Whatever the merits of the above mentioned existing systems and methods, they do not achieve the benefits of the present invention.

SUMMARY OF THE DISCLOSURE

To overcome the limitations in the prior art described above, and to overcome other limitations that will become apparent upon reading and understanding the present specification, the present invention discloses a process for selectively heating portions of a heterostructure having relatively higher microwave absorption while minimally heating portions with lower microwave absorption. This allows a highly microwave absorbing portion or material to be annealed while refraining from heating a less microwave absorbing portion or material.

Free electron density is directly proportional to microwave absorption in conductors. Thus, portions of a heterostructure that have higher free electron density will also have higher microwave absorption within a penetration depth, which depends on the particular portion's properties. This allows a penetration depth of the portion of the heterostructure that has higher microwave absorption, or higher electron density, to be selectively annealed without significantly heating the lower microwave absorbing portion, or lower electron density portion.

First, a microwave cavity is properly tuned to resonant conditions, including tuning the impedance and the resonant frequency. Second, the heterostructure is placed in the microwave cavity. The microwave cavity is then tuned again. Next, a first portion of the heterostructure, having a relatively higher microwave absorption coefficient and thickness on the order of the skin depth, absorbs power produced from the microwaves uniformly so that the first portion is heated. A second portion with a lower microwave absorption coefficient than the first material is not heated, or insignificantly heated, in relation to the first portion. Alternatively, the heterostructure can have a third portion with a high microwave absorption coefficient, such that the skin depth is on the order of the thickness of the third portion, effectively shielding the second portion from the microwaves.

In addition, since there will be heat transfer between the portions, the microwave field is pulsed so that the first portion heats to the desired temperature. The power is then turned off and the heat is distributed throughout the heterostructure. The amount of heat in the first portion is not enough to significantly elevate the temperature of the second portion and all portions are allowed to equilibrate. The process is then reiterated until the desired results in the first portion are achieved.

For example, the interconnects of a semiconductor wafer can be improved by transiently annealing the interconnect during a brief period. Improvement of interconnections can be achieved because prior methods of annealing metal and depositing metal onto a substrate produce a non-conformal coating on the substrate as well as in the grooves of the substrate. This non-conformal coating produces unwanted voids, vias and holes near the grooves. However, the technique provided in accordance with the present invention can be performed after the above process to improve the interconnections. The interconnect undergoes several microstructural changes allowing the metal to be transported properly onto the substrate and into the grooves of the substrate to produce a conformal coating.

Post deposition annealing of the interconnect with microwaves allows the metal film to reflow by capillary driven surface diffusion. The metal is forced to planarize, thereby creating a thin film on the substrate. Also, all the grooves as well as vias and holes in the interconnect structure of the integrated circuit are filled by this reflow. In addition, the underlying substrate is not significantly heated or damaged. Thus, the interdiffusion of interconnect metals into the surrounding dielectric is minimized by minimizing the amount of heating of the dielectric or substrate.

A feature of the present invention is the ability to selectively heat and anneal a portion of a heterostructure while refraining from similarly heating another portion. Another feature of the present invention is to uniformly heat a first material in close proximity to a second material without significantly heating the second material. Yet another feature of the present invention is a technique to solve and correct the inaccurate and imprecise interconnects of physical vapor deposition fabrication.

An advantage of the present invention is that device problems with integrated circuits are minimized. Another advantage of the present invention is the use of lower processing temperatures. Another advantage of the present invention is that a first portion of a heterostructure can be rapidly annealed onto a second portion so that the diffusion of the second portion is minimized while the first portion is heated. Yet another advantage of the present invention is to increase and improve the conductivity of existing interconnects of an integrated circuit.

BRIEF DESCRIPTION OF THE DRAWINGS

Referring now to the drawings in which like reference numbers represent corresponding parts throughout:

FIG. 3 illustrates a cross sectional view of a substrate film before physical vapor deposition during integrated circuit fabrication;

FIG. 4 illustrates a cross sectional view of the substrate film of FIG. 3 after physical vapor deposition during integrated circuit fabrication; and FIG. 5 illustrates a cross sectional view of the heterostructure of FIG. 4 after being thermally annealed in accordance with the present invention.

DETAILED DESCRIPTION OF THE PREFERRED EMBODIMENT

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Figure 1:
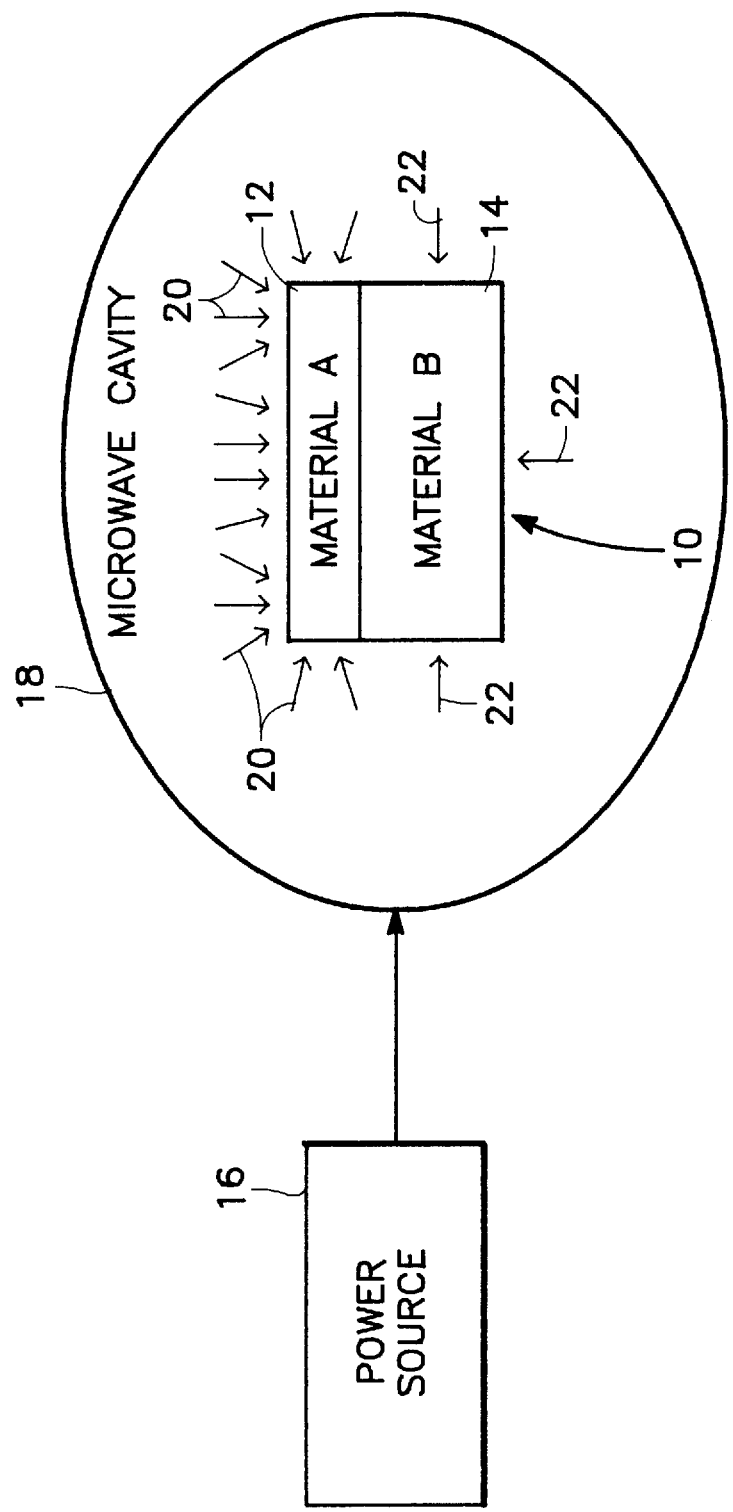
FIG. 1 illustrates a block diagram of the fabrication technique in accordance with the present invention.

FIG. 1 illustrates a block diagram of the fabrication technique in accordance with the present invention. The present invention provides an apparatus and method for selectively annealing portions of a heterostructure 10. The heterostructure 10 comprises a portion 12 or material A that has higher free electron density than a portion 14 or material B with lower free electron density. A power source 16 provides a microwave cavity 18 with microwaves.

Microwave absorption of any material is directly proportional to the density of free electrons in the material because microwave radiation causes molecules in the heterostructure 10 to vibrate, thereby producing heat. Highly conductive materials, such as metals, have high free electron density, while semiconductors and insulators have lower free electron density comparatively. Also, a doped region of the semiconductor or heterostructure will have higher free electron density as compared with a non-conductive area. Hence, the microwave absorption of a metal is much higher than the microwave absorption of an insulator or semiconductor.

This difference in microwave absorption between a metal and an insulator allows portions 12 of the heterostructure 10 to be processed by the microwaves. Thus, the higher microwave absorption portions or material 12 of the heterostructure 10 highly absorbs microwaves 20 and is heated. However, the lower microwave absorbing material 14 absorbs less microwaves 22 comparatively and is not significantly heated. Moreover, the penetration depth of the microwave power into the metal layer is approximately the thickness of the metal layer (for a typical semiconductor heterostructure), so that very little microwave radiation directly reaches the underlying insulator or semiconductor layer. Thus, there is little or no direct heating of the underlying insulator or semiconductor layers by the microwave power, a significant advantage.

However, notwithstanding the lack of direct heating of the underlying insulator or semiconductor layers, there is conductive heat transfer or diffusion from the metal layer to the underlying insulator layer, which indirectly heats the entire heterostructure, so that some of the heat generated in the metal layer by the microwave power is transferred to the remainder of the heterostructure, a significant problem. This latter problem is solved in the invention by pulsing the microwave power applied to the heterostructure. It has been found that with an appropriate pulse rate and pulse width, the conductive heat transfer from the metal layer to the underlying insulating layer is greatly reduced or minimized. Another feature of the invention is to select a maximum temperature of the metal layer at which the metal re-flows to achieve the desired annealing but which is nevertheless sufficiently low so that the underlying insulating layer is not overheated. This is accomplished in the invention by limiting the time during which the pulsed microwave power is applied to the heterostructure so as to avoid raising the temperature of the metal layer beyond the selected maximum temperature. As soon as the maximum temperature is reached, the pulsed microwave power is turned off for at least a sufficient amount of time to permit the temperature of the metal and insulator layers to equilibrate throughout the entire heterostructure. If at this point the metal layer has not completely annealed or reflowed, the pulsed microwave power is again applied until the metal layer again reaches the selected maximum temperature. The entire process is thus repeated until the metal layer has completely annealed.

Figure 2:
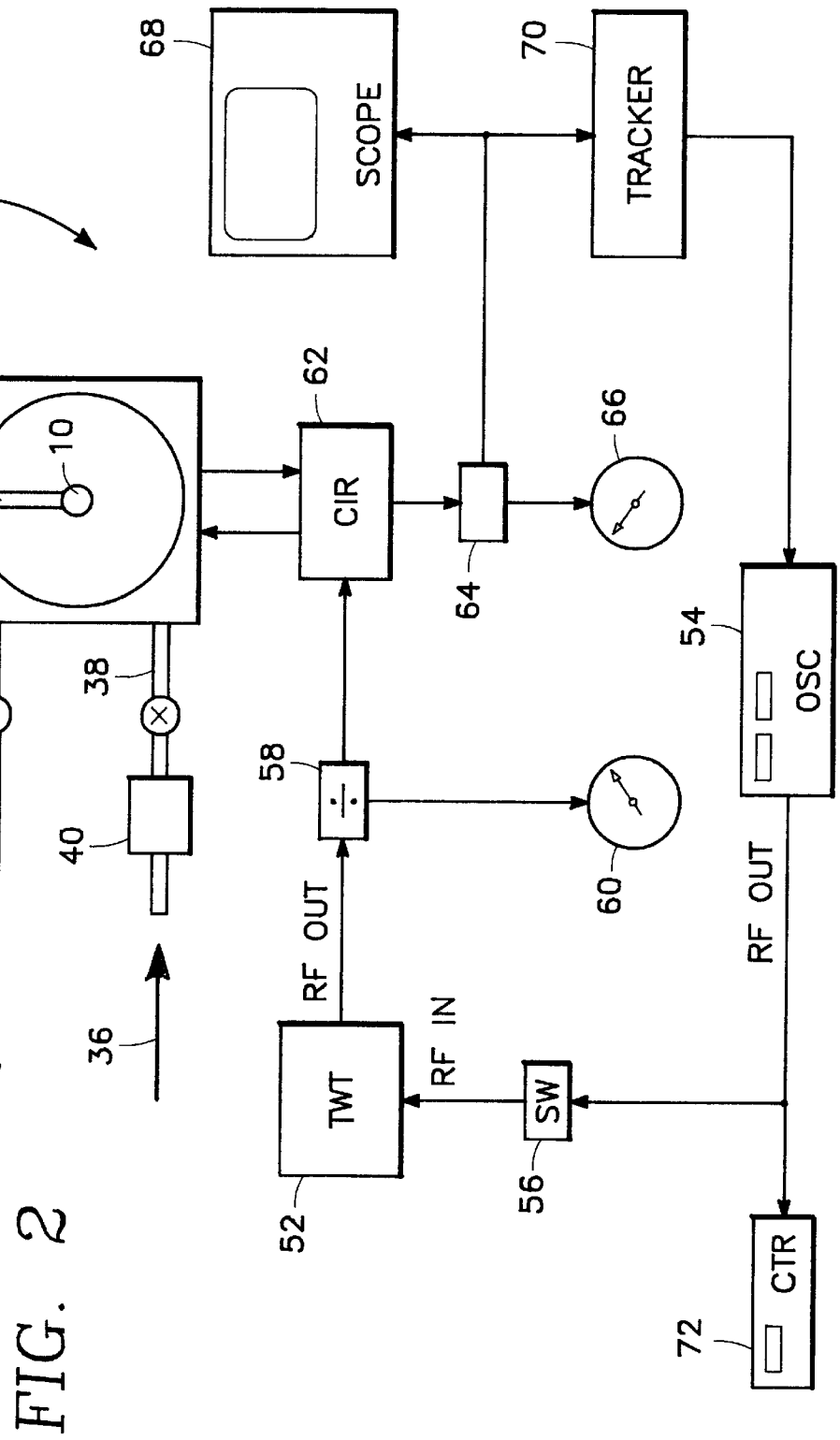
FIG. 2 illustrates an embodiment of the system in accordance with the present invention.

FIG. 2 illustrates one embodiment of the system in accordance with the present invention. The following is a description of a exemplary apparatus 30 for selectively annealing a heterostructure 10 using microwaves in accordance with the present invention.

Referring to FIG. 2, a sealed, cylindrical, copper microwave cavity 32 encloses the heterostructure 10. The microwave cavity 32 uses radiation in the short-wave region of the radio spectrum to selectively heat higher microwave absorbing portions of the heterostructure 10. The wavelengths of the microwaves are in the centimeter range and are longer than the wavelengths of infrared radiation. The frequencies of the microwaves range from 0.3 to 300 Gigahertz.

The cavity 32 has high heat energy production (large quality factor Q) and isolated mode separation so that the adjacent modes are sufficiently far away from each other thereby preventing overlap of modes during the microwave processing. The size of the cavity 32 can vary. For instance, a cavity 32 having a diameter of 1.350 inches and a height of 1.855 inches can be excited in an isolated TM010 mode at a frequency of 6.67 Gigahertz. Also, the unloaded quality factor (Q) of the TM010 mode in the empty cavity 32 can be very high, for example approximately 13000. A large quality factor (Q) indicates a strong field.

The heterostructure 10 is supported in the cavity 32 with, for example, a quartz support rod 34, which can be fork-shaped. In addition, the heterostructure can be positioned so that the maximum electric field is parallel to the film surface, which is preferably along the center axis of the cavity 32.

Argon gas 36 is provided to the cavity 32 through an input gas line 38. An impurity getter pump 40 purifies the argon gas 36 before it reaches the cavity 32. During operation, the cavity 32 is continuously recirculated with purified argon gas 36. The cavity 32 purges used argon gas 42 through an output gas line 44 while purified argon gas 36 is continuously provided to the cavity 32 through the input gas line 38.

Referring to FIG. 2, the cavity 32 is controlled and monitored by electronic equipment 50 and a control loop to ensure that the frequency exciting the cavity is continually adjusted to maximize the microwave field in the cavity. A sample electronic instrument arrangement includes a traveling wave tube amplifier (TWT) 52 which receives low level microwave frequency input from a sweep oscillator 54. A fast switch 56, such as a ten nanosecond switch, can be located in the power line from the sweep oscillator 54 to the TWT amplifier 52. The fast switch 56 can be operated in such a manner to perform the desired pulsing of the microwave power referred to previously herein, with the appropriate pulse width and pulse rate. The TWT amplifier 52 sends microwave output to the cavity 32. A first power divider 58 can be located between the TWT amplifier 52, the cavity 32, a power meter 60, and a circulator 62. The power meter 60 measures the forward power to the cavity 32. An o-ring sealed antenna (not shown) can be used after the circulator 62 to guide and direct the microwaves into the cavity.

The circulator 62 receives the microwave input from the TWT amplifier 52 through the first power divider 58 and sends the microwave input to the cavity 32. The first power divider 58 also sends the microwave signal to the power meter 60 which measures the forward power. The circulator 62 also receives reflected power from the cavity 32. A second power divider 64 is connected to the circulator 62 and receives the reflected output from the circulator 62. The second power divider 64 sends the reflected power to a second power meter 66 which measures the reflected power. In addition, the second power divider 64 sends the reflected output from the cavity 32 to an oscilloscope 68 and a peak frequency tracker 70 for additional measurements.

A frequency counter 72 also receives microwave input from the sweep oscillator 54 for monitoring the microwave frequency going into the cavity 32. The sweep oscillator 54 receives a frequency modulation input (FM) from the peak tracker 70 which receives input from the second power divider 64. The oscilloscope 68 receives the reflected output from the cavity 32 and monitors the signal amplitude. The peak tracker 70 receives the reflected power signal and determines if the drive frequency from the oscillator 54 is not at the peak of the excited mode. The peak tracker 70 provides an error signal to the oscillator 54 through the FM input to force the oscillator frequency to always be at the mode resonance.

Quality factor (Q) measurements are taken during heating by switching the microwave cavity 32 power off for a few microseconds and observing the reflected power decay. During heating, the resonant frequency is tracked by the peak tracker control loop to thereby adjust the input frequency to minimize the reflected power. Further, a non-contact temperature measuring device, such as an optical pyrometer (not shown), can be aligned through a sealed window (not shown) in the top of the cavity 32 to measure the temperature of the heterostructure 10 during heating. This measuring device monitors and controls the microwave power input so that a constant temperature at the measurement point is maintained. Thus, the control loop maximizes the power transfer from the microwave source to the higher absorbing portion of the heterostructure 10 by continually tracking the resonant frequency of the excited mode.

One exemplary use of the present invention is to enhance and improve physical vapor deposition techniques for metal interconnect fabrication of an integrated circuit. Proper annealing by microwaves provides localized heating of the targeted material 12 of FIG. 1. This localized heating causes the material 12 to undergo several microstructural changes, such as grain growth in the crystals and grains in the polycrystalline metal. Simultaneously, non-targeted portions 14 are not similarly heated and therefore undamaged. Both results are ideal for interconnect improvement. Thus, microwave annealing provides an excellent technique for use in the thermal processing of thin films for integrated circuit applications.

FIG. 3 illustrates a cross sectional view of a substrate film 80 before physical vapor deposition during integrated circuit fabrication. An integrated circuit in the form of a semiconducting wafer includes an oxidized semiconductor substrate slice 80, which can be silicon dioxide ($SiO_2$). The substrate 80 has defined geometric features in the form of a pattern 82 of grooves 84. The grooves 84 of the pattern 82 are approximately 0.8 micrometers deep and about 0.2 micrometers to 1.0 micrometers wide. Conducting material in the form of thin films, such as copper (Cu) or aluminum (Al), is deposited onto the substrate 80 and into the patterned 82 grooves 84 to interconnect components within the semiconducting wafer.

FIG. 4 illustrates a cross sectional view of the substrate film 80 of FIG. 3 after physical vapor deposition during integrated circuit fabrication. Sputtering (ion bombardment), for example, can be used during integrated circuit fabrication. First, a metal film, such as copper, is grown, for example, in a load lock-equipped ultrahigh vacuum ion beam sputtering physical vapor deposition system with base pressure in the low $10^{-9}$ Torr regime. A copper layer 88 approximately 0.8 micrometers to 1.0 micrometer thick is ideally deposited onto the substrate film 80 and into the grooves 84 by argon ion beam sputtering at a deposition rate of 0.06 nanometers per second.

However, excessive sputtering heats both the substrate 80 and the metal 88. This heating or diffusing of the metal onto the substrate 80 causes device defect problems in the integrated circuit. Also, sputtering the metal 88 into the grooves 84 of the substrate 80 is not exact and is not ideally a complete process. The grooves 84 are not fully filled in, thus creating voids 90 and trenches 91. This defect in sputtering often produces poor and unreliable conduction within the circuit interconnections of the semiconductor.

The attempted filling of the grooves 84, voids 90 and trenches 91 in the copper 88 (without the microwave annealing of the present invention) exhibit poor step coverage which is unacceptable for interconnect metallization, especially for ultra large scale integrated (ULSI) semiconductor circuits. This poor step coverage significantly degrades the interconnect reliability.

Aspect ratios of approximately 1:1 produce clear gaps 91 in the copper 88. As aspect ratios become greater than 2.5:1, smaller amounts of copper 88 are deposited into the grooves 84. Also, since sputtering is not reliable and leaves voids 90 and trenches 91, large aspect ratio integrated circuit fabrication is difficult and nearly impossible, thus limiting the size of the integrated circuit to be fabricated. However, microwave annealing of thin films solves several problems of physical vapor disposition.

FIG. 5 illustrates a cross sectional view of the substrate 80 of FIG. 4 after microwave annealing in accordance with the present invention. The lack of conformal filling by conventional techniques in interconnect metallization is solved by post microwave annealing without excessive heating of the substrate 80. After physical vapor deposition, microwave annealing causes the metal film to diffuse and fill the voids 90 and trenches 91 in the groove pattern 82 of the substrate 80. The grooves 82 have sub-micron width and have aspect ratios up to 3:1. The invention can limit the temperature of the heterostructure 10 to be less than 500 degrees celsius while achieve a thorough annealing of the metal layer, a significant advantage.

First, referring back to FIG. 2, the microwave cavity 32 is properly tuned to resonant conditions, including tuning the impedance and the resonant frequency. The microwave pulse width and duty cycle (controlled by the operation of the fast switch 56) are set to values which minimize heat transfer from the metal layer to the underlying insulating layer. For example, in the case of a copper metal layer overlying a silicon dioxide insulating layer, the pulse rate can be on the order of approximately 1 second and the duty cycle can be on the order of about 50% (so that the time between pulses is equal to the pulse width). These parameters will vary, depending upon the choice of materials for the metal layer on the insulating layer. The heterostructure 10 is then placed in the microwave cavity 32 and has to be tuned again. Next, the metal 92, which has a relatively higher microwave absorption coefficient and thickness on the order of the microwave penetration depth, absorbs power produced from the microwaves uniformly so that the metal 92 is heated. The substrate 80, with a lower microwave absorption coefficient than the metal 92, is heated insignificantly, in relation to the metal 92. Alternatively, the heterostructure 10 can have a third portion 94 (indicated in dashed line in FIG. 3) with a high microwave absorption coefficient, such that the skin depth is on the order of the thickness of the third portion 94, effectively shielding the underlying portion of the substrate 80 from the microwaves.

In order to avoid excessive heat transfer to the substrate 80, the pulsed microwave field is applied only until the metal 92 heats to the selected maximum temperature. At this point, the microwave power is turned off for at least a sufficient amount of time to permit the heat to equilibrate throughout the heterostructure 10. The process is then reiterated, if necessary, until the desired degree of annealing or reflowing of the metal 92 is achieved.

The method and apparatus of the present invention selectively heats the metal 92 and only minimally heats the substrate 80 because (a) the microwave power is pulsed, (b) the microwave penetration depth through the metal is about the thickness of the metal and (c) the metal is allowed to heat only to a selected maximum temperature, at which point the pulsed microwave power is temporarily turned off to allow the metal and insulator layer temperatures to equilibrate. At the selected maximum temperature, the metal 92 sufficiently hot to diffuse and fully reflow into the grooves 84 of the substrate 80 uniformly. As one example, in the case of a copper metal layer overlying a silicon dioxide insulating layer, the maximum temperature of the copper metal layer is less than 500 degrees Celsius and preferably on the order of about 300 degrees Celsius. This selected maximum temperature is sufficient to reflow the copper but still sufficiently low to avoid excessively heating the underlying insulator layer. The selected maximum temperature will vary depending upon the choice of materials for the metal layer and the underlying insulator layer. Again, the substrate 80 is minimally heated since the energy is absorbed by the metal 92 and the penetration depth of the microwave energy into the metal film 92 corresponds to approximately the thickness of the metal film 92. Thus, since the metal film 92 is heated quickly for a short time, the substrate 80 is not overexposed to heat.

For example, the heterostructure 10 of FIG. 4, that has copper 88 already deposited onto the substrate 80 by physical vapor deposition, is removed from the physical vapor deposition vacuum system and placed into the cavity 32 of FIG. 2 for post annealing. The heterostructure 10 is then annealed in the microwave cavity 32. For example, a one quarter inch cross sectioned area of wafer is heated for 30 seconds to about 300 degrees Celsius with an input power of 1.2 Watts. This post microwave annealing of the heterostructure 10 of FIG. 4 solves the poor interconnect problem. During the annealing procedure, the temperature of the copper surface can be monitored with the optical pyrometer and also by visual inspection. The temperature of a copper film with an emissivity of 0.13 is typically less than 300 degrees Celsius, so that the pulsed microwave power is preferably turned off whenever this level of emissivity is reached.

The average copper grain size after annealing grows to about 0.9 micrometers. Solid state grain growth indicates that the copper is not melted during microwave annealing. Thus, this post deposition annealing of FIG. 5 of the metal allows the metal film 92 to reflow by capillary driven surface diffusion. This capillary driven surface diffusion forces the metal to planarize so that the metal creates a thin film 92 thereby completely filling all the grooves 84 as well as voids 90 and trenches 91 of FIG. 4 in the interconnect structure of the integrated circuit. In addition, the underlying substrate 80 is not significantly heated or damaged thereby minimizing the interdiffusion of interconnect metals into the surrounding dielectric 80.

There are other applications, such as, rapid thermal processing during doping of the silicon where microwave heating is useful. Rapid thermal processing requires quick heating of the wafer since the wafer must be annealed very quickly to near a thousand degrees in about a minute. In addition to the wafer being annealed very quickly, the wafer also has to be cooled very quickly.

Currently, infrared heating of a silicon wafer with an infrared lamp is performed in order to activate the doped region in the wafer. When the wafer is heated, the ions in the wafer move slightly and diffuse to match the silicon microstructure. If the ions are annealed properly, the ions will move into the desired location and lock into this location when the wafer is cooled. However, infrared heating exposes the entire wafer to intense heat. This often damages portions of the wafer due to unnecessary thermal exposure.

It should be noted that microwaves will be absorbed by the most highly absorbing material in the cavity. Thus, in post annealing of a wafer containing a thin metal film, the film absorbs most of the energy. However, if there is no metal film on the wafer, then most of the microwave energy is absorbed by the wafer. Consequently, in contrast to the infrared heating, microwaves will volumetrically heat the entire wafer which leads to fast uniform heating.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for selectively post annealing a heterostructure comprised of a lower microwave absorption material having patterned grooves and a physical vapor deposited high microwave absorption metal film deposited thereon, comprising the steps of:

placing said heterostructure into a cavity producing microwaves;

exposing said heterostructure in said cavity to pulsed microwaves resonant with a mode of said cavity so that said metal film is heated by absorbing power from said microwaves sufficient to cause diffusion of said metal film within said patterned grooves, said pulsed microwaves having a characteristic pulse width and duty cycle tending to prevent localized heating of said lower microwave absorption material.

2. The method of claim 1 further comprising interrupting exposure of said heterostructure to said pulsed microwaves whenever said metal film reaches a selected temperature for a sufficient amount of time to permit the heat in said metal layer to equilibrate with the remainder of said heterostructure.

3. The method of claim 2 wherein said selected temperature is sufficiently high to cause reflowing by capillary driven surface diffusion of said metal layer and sufficiently low to minimize heat transfer from said metal layer to the remainder of said heterostructure.

4. The method of claim 1 wherein said microwaves are resonant with only a single mode of said cavity.

\* \* \* \* \*